(12) United States Patent
Kim et al.

(10) Patent No.: US 7,414,264 B2
(45) Date of Patent: Aug. 19, 2008

(54) POLY CRYSTALLINE SILICON SEMICONDUCTOR DEVICE AND METHOD OF FABRICATING THE SAME

(75) Inventors: Do-young Kim, Gyeonggi-do (KR); Takashi Noguchi, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 237 days.

(21) Appl. No.: 11/022,766

(22) Filed: Dec. 28, 2004

(65) Prior Publication Data
US 2005/0139924 A1 Jun. 30, 2005

(30) Foreign Application Priority Data
Dec. 30, 2003 (KR) .................. 10-2003-0100618
Jul. 8, 2004 (KR) .................. 10-2004-0052982

(51) Int. Cl.
*H01L 31/00* (2006.01)
*H01L 21/00* (2006.01)
*G02F 1/136* (2006.01)

(52) U.S. Cl. .................. 257/59; 257/66; 257/72; 438/149; 438/151; 349/42; 349/43

(58) Field of Classification Search ......... 438/149–155; 257/59, 64, 66, 72; 349/42–47
See application file for complete search history.

(56) References Cited

U.S. PATENT DOCUMENTS 5,817,550 A 10/1998 Carey et al.
2002/0057248 A1* 5/2002 Matsushima .................. 345/92
2004/0061176 A1* 4/2004 Takafuji et al. .............. 257/347

FOREIGN PATENT DOCUMENTS

KR 1998-0011681 4/1998
KR 2001-0053695 7/2001

OTHER PUBLICATIONS

Korean Office Action dated Mar. 10, 2006.

* cited by examiner

*Primary Examiner*—Hsien-ming Lee
(74) *Attorney, Agent, or Firm*—Buchanan Ingersoll & Rooney PC

(57) ABSTRACT

Provided are a poly crystalline silicon semiconductor device and a method of fabricating the same. Portions of a silicon layer except for gates are removed to reduce a parasitic capacitance caused from the silicon layer existing on gate bus lines. The silicon layer exists under the gates only, thus the parasitic capacitance is reduced and the deterioration and the delay of signals are prevented. Accordingly, the poly crystalline silicon semiconductor device, such as a thin film transistor, has excellent electric characteristics.

10 Claims, 20 Drawing Sheets

POLY CRYSTALLINE SILICON SEMICONDUCTOR DEVICE AND METHOD OF FABRICATING THE SAME

BACKGROUND OF THE DISCLOSURE

Priority is claimed to Korean Patent Applications No. 10-2003-0100618, filed on Dec. 30, 2003, and No. 10-2004-0052982, filed on Jul. 8, 2004, in the Korean Intellectual Property Office, the disclosure of which is incorporated herein in its entirety by reference.

1. Field of the Disclosure

The present invention relates to a poly crystalline silicon semiconductor device and a method of fabricating the same, and more particularly, to a poly crystalline silicon thin film transistor (TFT) and a method of fabricating the same for efficiently reducing the capacitance of gate bus lines.

2. Description of the Related Art

Poly crystalline silicon, which will be referred to as poly-Si hereafter, has characteristics of high mobility and excellent optical stability compared to amorphous silicon. Such poly-Si is used in various application fields, mainly in TFT and memory devices. Poly-Si TFTs are used as switching devices in displays. Examples of displays using an active device, such as TFTs, are TFT-LCDs and TFT-OLEDs.

In TFT-LCDs and TFT-OLEDs, TFTs are arranged in each pixel, which is arranged on an X-Y matrix. The performance of an LCD and an OLED in which a plurality of TFTs are arranged depends on the electric characteristics of the TFTs. One of the important characteristics of the TFT is the mobility of a silicon active layer. In order to improve the mobility of the silicon active layer, the silicon active layer should be crystallized. Studies of crystalline silicon are focused on the development of poly-Si, which is similar to mono crystalline silicon.

On the other hand, LCDs using plastic substrates, which are easily damaged by heat and flexible, unlike glass substrates, are being developed, in order to reduce the price of the LCD. In addition, a plastic substrate will be inevitably used in paper-like, flexible displays, which is a next-generation model.

However, the defect of plastic being easily damaged by heat requires a low temperature process to apply a plastic substrate to an LCD. Carry et al. disclosed a method of preventing damages on plastic when forming silicon channels on a plastic substrate, in U.S. Pat. No. 5,817,550.

However, the method provided by Carry et al. results in a silicon film remaining, as an active region, under gates and as an unnecessary capacitive element under gate bus lines. The gate bus lines are formed with the gates, thus a gate insulating material and silicon for forming channels remain under the gate bus line.

This is because a gate metal is patterned, in other words, doped and activated, after depositing the gate insulating layer and the gate metal on the silicon and before patterning the channels. Thus the silicon remaining on regions outside channel regions is not eliminated.

The silicon remaining under the gate bus lines and having a high dielectric constant generates an unnecessary parasitic capacitance between the gate bus lines and the substrate. In addition, the parasitic capacitance forms a line resistance of the gate bus lines and an RF differential circuit, thus distorts and delays the transfer of signals to the gates. Such a parasitic capacitance problem is generated in a semiconductor device having a plurality of transistors, for example, a CMOS.

SUMMARY OF THE DISCLOSURE

The present invention provides a poly crystalline silicon semiconductor device and a method of fabricating the same to efficiently prevent the distortion and delay of gate signals caused from a parasitic capacitance by eliminating the cause of the parasitic capacitance in gate bus lines that are shared by gates of a silicon semiconductor device, for example, a thin film transistor (TFT) or a CMOS.

According to an aspect of the present invention, there is provided a TFT comprising a substrate, a silicon film layer having a drain and a source, which are defined by doping, and a channel region between the drain and the source, a gate having contact units for electrically connecting a region overlapping the channel region to the outside, a gate insulating layer formed under the gate, a drain bus line in a first direction for electrically connected through a contact unit of the drain, and a gate bus line extending in a second direction, which is perpendicular to the first direction, and electrically connected through the contact unit of the gate.

According to another aspect of the present invention, there is provided a method of fabricating a TFT including a silicon film layer having a drain and a source defined by doping and a channel region between the drain and the source, a gate corresponding to the channel region, and a gate insulating layer formed under the gate, the method comprising forming a silicon material layer on a substrate, forming a gate insulating material layer on the silicon material layer, forming a gate material layer on the gate insulating material layer, forming a gate corresponding to the channel region and a gate insulating layer under the gate by patterning the gate material layer and the gate insulating material, doping and activating a portion of the silicon material layer, which is not covered by the gate, forming a channel region, which is covered by the gate, and a source and a drain, which are not covered by the gate, by patterning the silicon material layer, forming a second insulating layer having contact holes corresponding to the source and the gate over the entire area of a material layer including the source, the drain, and the gate, and forming a source bus line and a gate bus line, which are electrically connected to the source and the gate through the contact hole, on the second insulating layer.

According to still another aspect of the present invention, there is provided a semiconductor device comprising a substrate, a couple of transistors including a silicon film layer having drains and sources defined by doping and channel regions between the drains and the sources, gates corresponding to the channel regions, and a gate insulating layer formed between the gates and the channel regions, a separated input line connected to the gates of the transistors, a separated output line connected to the source of a first transistor and the drain of a second transistor, a separated driving voltage line connected to the drain of the first transistor, and a ground line connected to the source of the second transistor.

An insulating layer having contact holes corresponding to the gates, the sources, and the drains of the transistors may be formed on the transistors, and the input line, the output line, the driving voltage line, and the ground line may be formed on the insulating layer.

The gates of the first and second transistors and the gate insulating layer under the gates may have the same pattern, and the input line, the output line, the driving voltage line, and the ground line may be formed of the same material. In addition, a channel region of a silicon film layer may be formed under the gates of the first and second transistors, over the entire region of the gates.

According to yet still another aspect of the present invention, there is provided a method of fabricating a semiconductor device including a first transistor and a second transistor having a substrate, a silicon film layer having drains and sources defined by doping and channel regions between the drains and the sources, gates corresponding to the channel regions, and a gate insulating layer formed under the gates, the method comprising forming a silicon material layer on a substrate, forming a gate insulating material layer on the silicon material layer, forming a gate material layer on the gate insulating material layer, forming gates of the first and second transistors and a gate insulating layer under the gates by patterning the gate material layer and the gate insulating material, doping a first impurity to portions except for the channel, the source, and the drain of the first transistor, doping a second impurity to portions except for the channel, the source, and the drain of the second transistor, forming the channel regions covered by the gates of the first and second transistors and the sources and the drains not covered by the gates of the first and second transistors by patterning the silicon material layer, forming an insulating layer on the structure, and forming electric connection units of electrically connecting to the sources, the drains, and the gates of the first and second transistors, on the insulating layer.

The formation of the electric connection units may further comprise forming contact holes corresponding to the sources, the drains, and the gates of the first and second transistors, in the insulating layer, and forming a metal layer on the insulating layer and patterning the metal layer. In addition, the formation of the silicon material layer on the substrate may comprise depositing an amorphous silicon and crystallizing the amorphous silicon. The first impurity may be B+ and the second impurity may be P+.

BRIEF DESCRIPTION OF THE DRAWINGS

The above and other features and advantages of the present invention will become more apparent by describing in detail an exemplary embodiment thereof with reference to the attached drawings in which.

DETAILED DESCRIPTION OF THE DISCLOSURE

The present invention will now be described more fully with reference to the accompanying drawings, in which an exemplary embodiment of the invention is shown.

Figure 1:
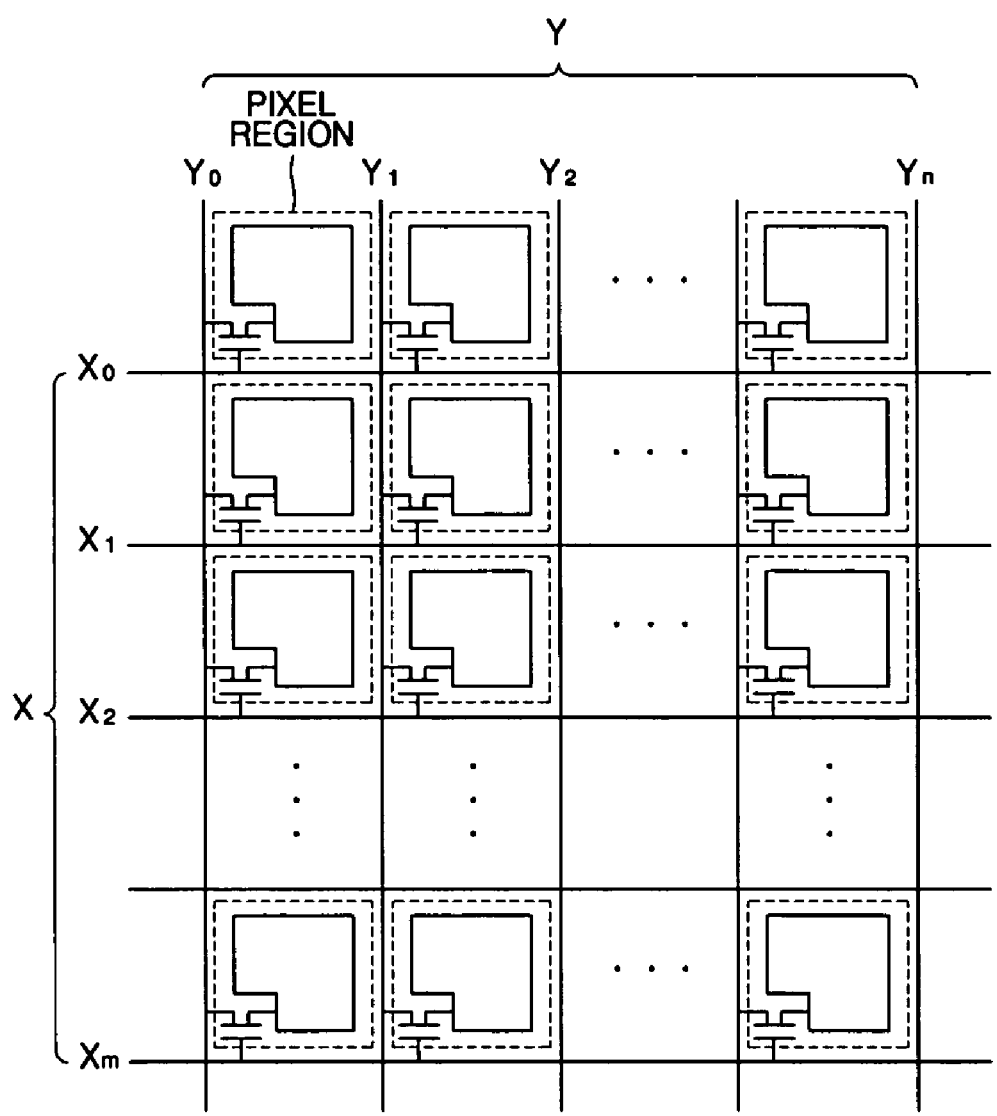
FIG. 1 is a plain view illustrating the structure of an active matrix flat panel display to which a thin film transistor (TFT) according to an embodiment of the present invention.

A thin film transistor (TFT) according to the present invention is arranged on a substrate in an X-Y matrix type and applied to an active matrix liquid crystal display (AM-LCD) or an active matrix organic light emitting device (AM-OLED). An X-Y matrix structure is formed of a plurality of gate bus lines $X_0$ through $X_m$ and a plurality of source bus lines $Y_0$ through $Y_n$ that are perpendicular to each other as shown in FIG. 1. In addition, TFTs and pixel electrodes are arranged in pixel regions, which are defined in the crossing portions of the bus lines. Here, the pixel electrodes may be the pixel electrodes of an OLED and the pixel electrodes of an LCD.

Figure 2:
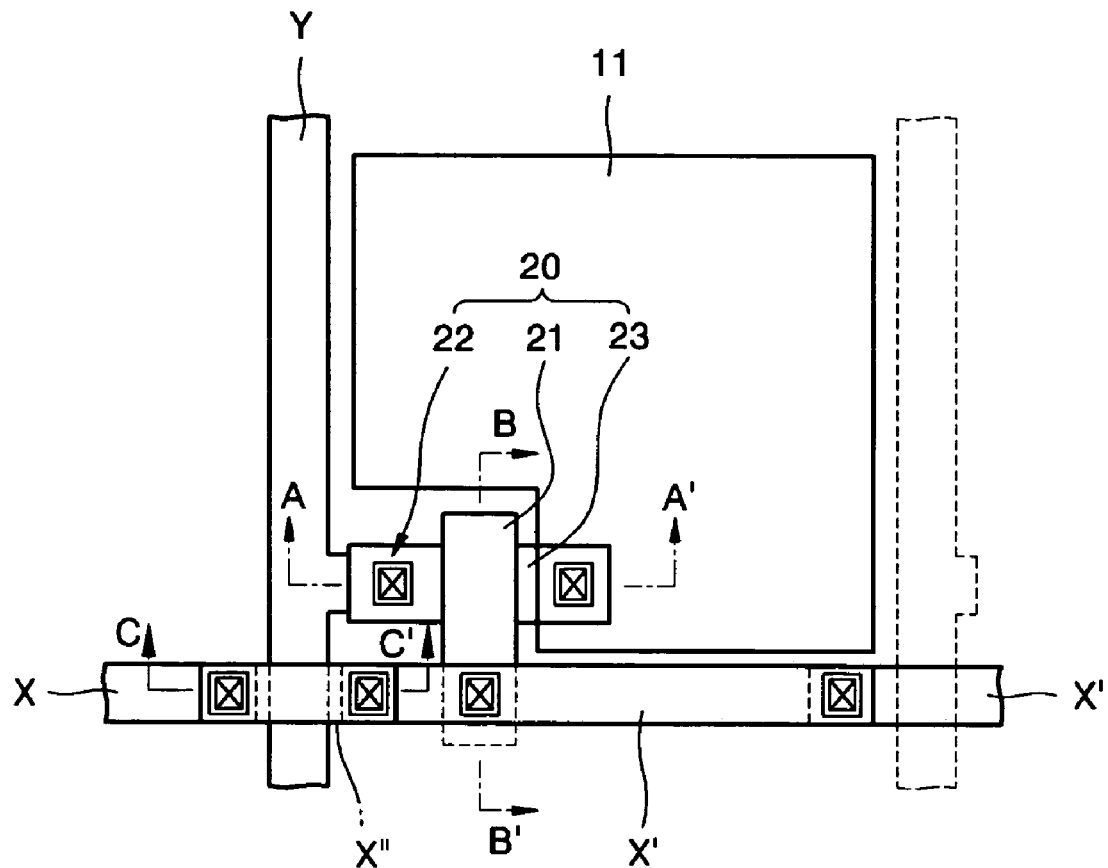
FIG. 2 is a plain view illustrating one pixel of the flat panel display of FIG. 1.

FIG. 2 is a plain view illustrating one pixel region of the TFT of FIG. 1. Here, the pixel region of FIG. 2 illustrates the arrangement of a TFT 20, a pixel electrode 11, a source bus line Y, and a gate bus line X.

Referring to FIG. 2, the source bus line Y and the gate bus line X are arranged to be perpendicular to each other, and the source bus line Y and the gate bus line X are electrically separated at the crossing portion by an insulating layer (not shown). The gate bus line X includes a jumper line X" arranged at the crossing portion and a main line X' arranged between the crossing portions. The jumper line X" and the main line X' are formed by separate processes, and the jumper line X' and the main line X' are connected through contact units ■. The portions denoted by ■ in FIG. 2 are the contact units having contact holes, which electrically connect elements that are located on and under an insulating layer. The TFT 20 and the pixel electrode 11 are arranged in the pixel region. The contact units connect the TFT 20, the pixel electrode 11, the source bus line Y, a source 22, and the main line X' of the gate bus line X. Here, the gate bus line X is not only being divided into two portions, in other words, the main line X' and the jumper line X", but also the gate bus line X is separated from a gate 21. In a conventional TFT, a gate bus line and a gate are integrally formed, because the gate bus line and the gate are obtained from one metal layer. The gate bus line X is separated from the gate 21 in order to eliminate a silicon material layer located under the gate bus line that is the problem of the conventional TFT. In the conventional TFT, the silicon material layer located under the gate bus line is used to form channels. However, the TFT according to the present invention does not form a silicon material layer under the gate bus line X.

Figure 3:
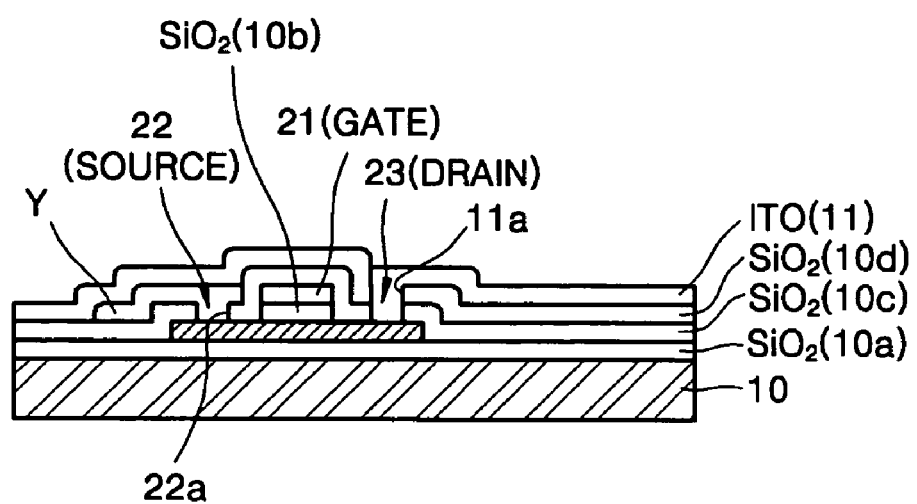
FIG. 3 is a sectional view cut along the line A-A' of FIG. 2.

FIG. 3 is a sectional view cut along the line A-A' of FIG. 2 and illustrating the structure of the TFT 20.

Referring to FIG. 3, a $SiO_2$ first insulating layer 10a is formed on a substrate 10, and a silicon film layer of poly-Si 24 (FIG. 4) is located on the $SiO_2$ first insulating layer 10a. Here, the silicon film layer includes an active layer and a source 22 and a drain 23 that are located at both sides of the active layer. A second insulating layer 10b as a $SiO_2$ gate insulating layer and a gate 21 are stacked at the center of the silicon film layer, in other words, on a channel. The gate 21 and the second insulating layer 10b located under the gate 21 are patterned at the same time, thus the gate 21 and the second insulating layer 10b have the same plain structure. In addition, a $SiO_2$ third insulating layer 10c as a first interlayer dielectric (ILD) is formed on the structure. A source contact hole 22a corresponding to the source 22 is formed in the third insulating layer 10c, and the source bus line Y is connected to the source contact hole 22a. A $SiO_2$ fourth insulating layer 10d as a second ILD is formed on the source bus line Y. A drain contact hole 11a is formed on the drain 23 to penetrate the third and fourth insulating layers 10c and 10d, and the pixel electrode 11 is connected to the drain contact hole 11a.

Figure 4:
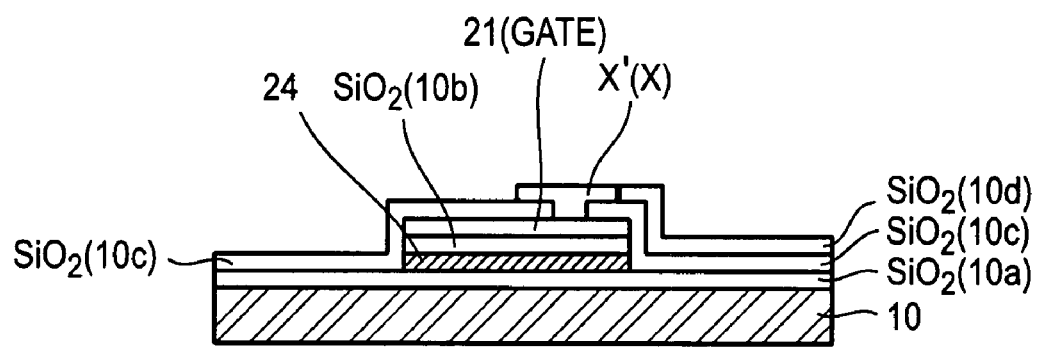
FIG. 4 is a sectional view cut along the line B-B' of FIG. 2.
Figure 5:
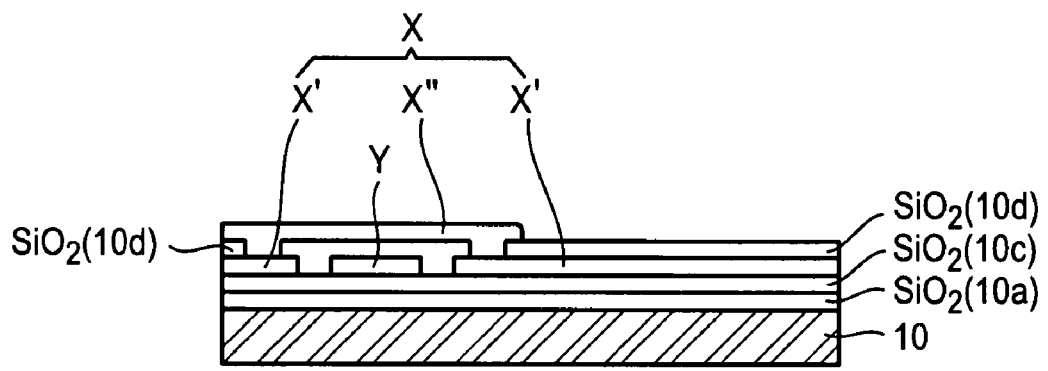
FIG. 5 is a sectional view cut along the line C-C' of FIG. 2.

FIG. 4 is a sectional view of the gate 21 cut along the line B-B' of FIG. 2 and illustrating the gate 21 and the gate bus line X connected to the gate 21. FIG. 5 is a sectional view cut along the line C-C' of FIG. 2 and illustrating the structure of the gate bus line X.

A silicon material layer 24 used to form the channel is located under the gate 21 as shown in FIG. 4, and the silicon material layer is absent under the gate bus line X as shown in FIG. 5. The gate 21 overlapping the channel 24 extends to the lower portion of the main line X' of the gate bus line X and contacts the main line X' of the gate bus line X through the contact hole formed in the third insulating layer 10c. In addition, the fourth insulating layer 10d is formed on the main line X' of the gate bus line X.

Referring to FIG. 5, the source bus lines Y are formed at both sides of the fourth insulating layer 10d, and the main lines X' formed between the source bus lines Y are connected through the jumper lines X" formed over the source bus lines Y.

In the TFT according to the present invention, the gate bus lines are separately formed from the gates, thus a silicon material layer is not located under the gate bus lines. Such a structure may be formed by dividing the gate bus lines into two elements and separately forming the gate bus lines from the gates.

A method of fabricating a TFT according to an embodiment of the present invention will now be described with reference to FIGS. 6A through 6M. Here, left portions of FIGS. 6A through 6M are plain views and right portions of FIGS. 6A through 6M are sectional views.

Figure 6A:
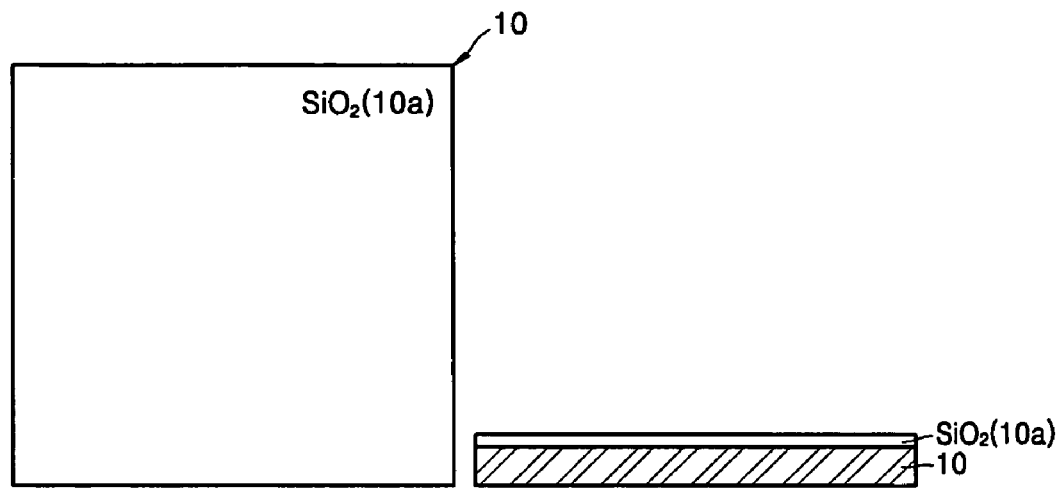
FIGS. 6A through 6M illustrate a method of fabricating a TFT according to an embodiment of the present invention.

Referring to FIG. 6A, a $SiO_2$ first insulating layer 10a is formed on a substrate 10 by CVD.

Figure 6B:
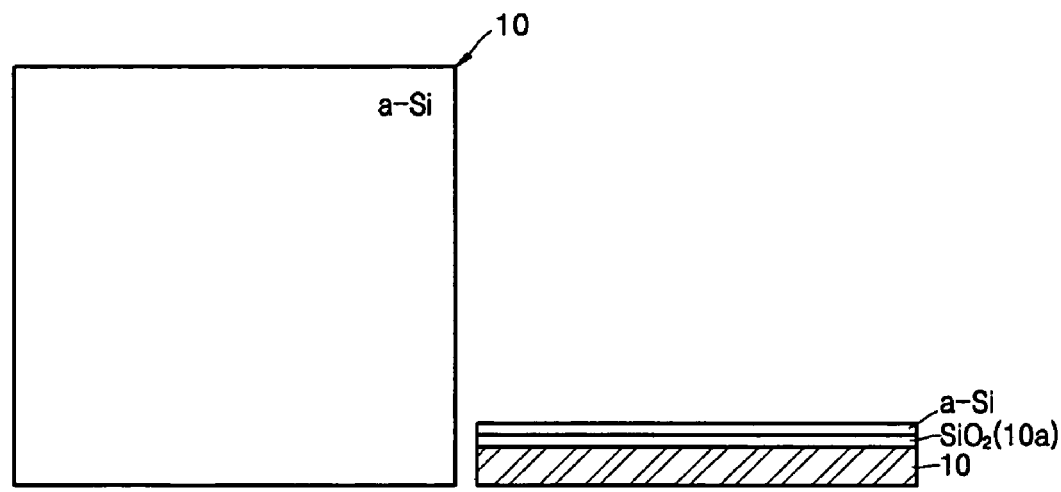

Referring to FIG. 6B, an amorphous silicon (a-Si) layer is formed on the substrate 10 on which the first insulating layer 10a is formed, by sputtering or PECVD.

Figure 6C:
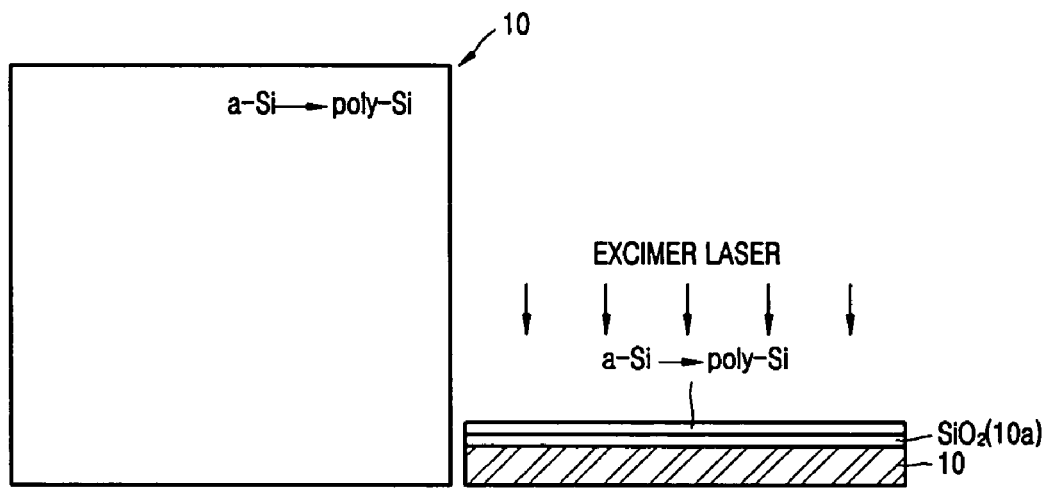

Referring to FIG. 6C, excimer laser annealing is performed on the a-Si layer to crystallize a-Si and obtain a poly-Si layer. Here, the excimer laser annealing is performed by shooting 308 nm XeCl excimer laser having an energy density of 150 to 300 $mJ/cm^2$ for once to ten times.

Figure 6D:
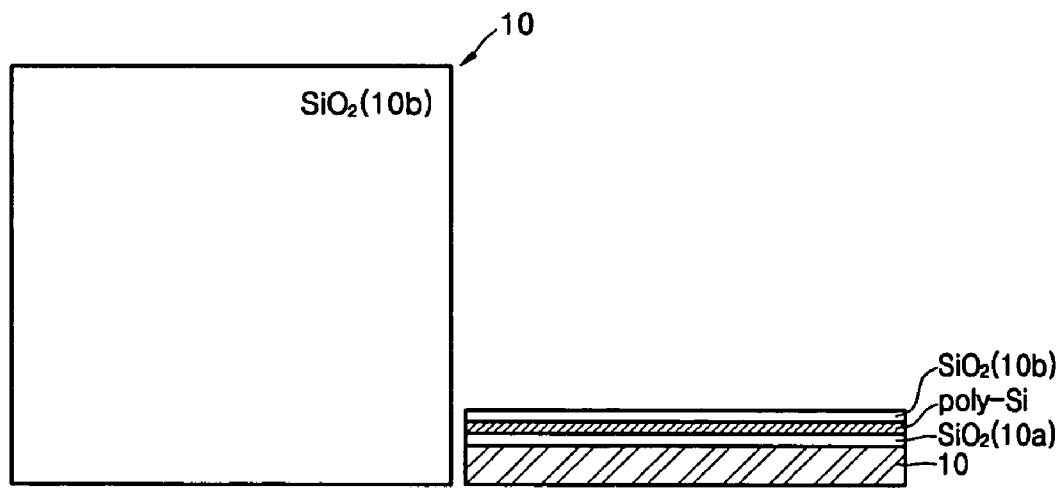

Referring to FIG. 6D, a $SiO_2$ second insulating layer 10b to be used as a gate insulating layer is formed on the poly-Si layer to a thickness of about 1,000 Å, by ICP-CVD, PE-CVD, or sputtering.

Figure 6E:
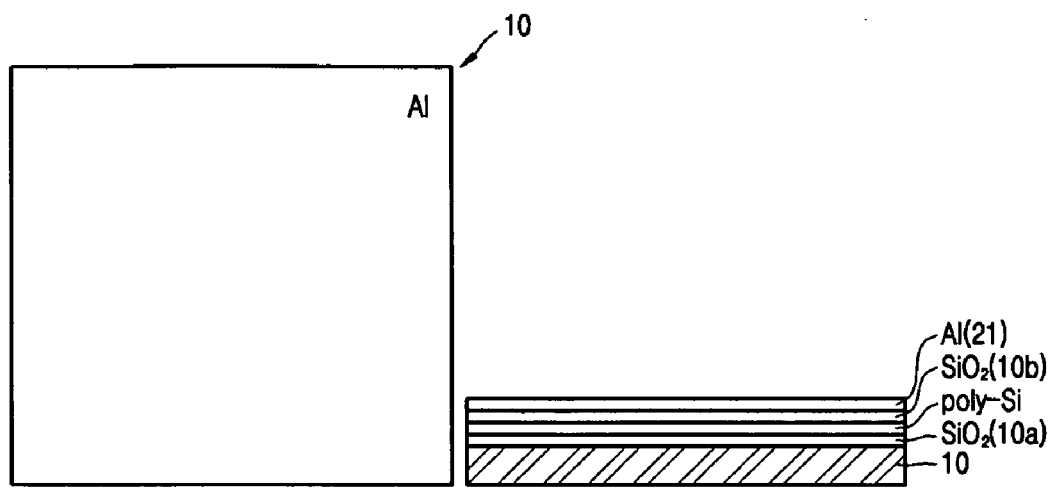

Referring to FIG. 6E, a metal layer to be used as a gate 21, for example, an Al layer, is formed on the second insulating layer 10b by sputtering.

Figure 6F:
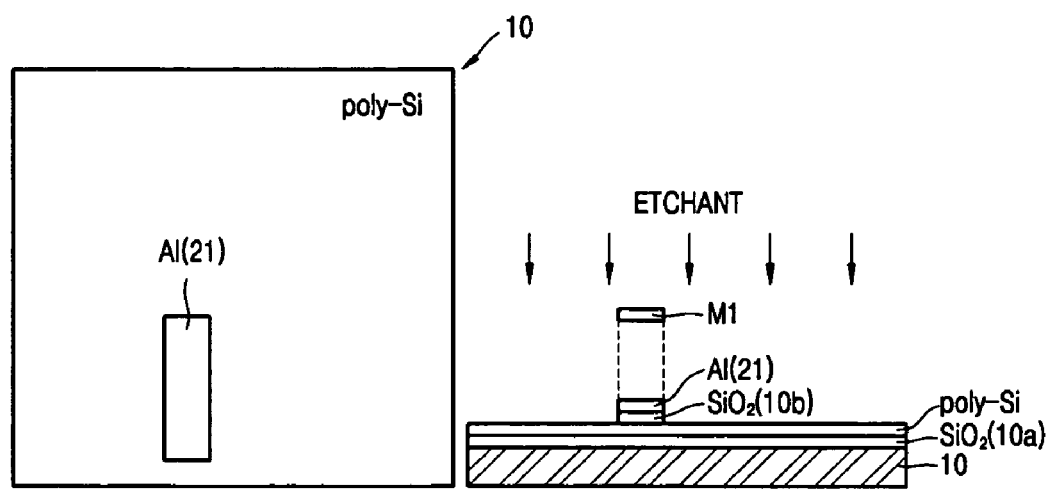

Referring to FIG. 6F, the Al layer is etched by dry etch, by using a first mask M1. Here, the first mask M1 has a pattern corresponding to the shape of the gate 21. Accordingly, the gate 21 is patterned, and the second insulating layer 10b under the gate 21 is patterned to the same shape as the gate 21. As a result, portions of the poly-Si layer, which are not covered by the gate 21, are exposed. The gate 21 is formed to have portions overlapping the channels of a TFT and portions located under the gate bus line.

Figure 6G:
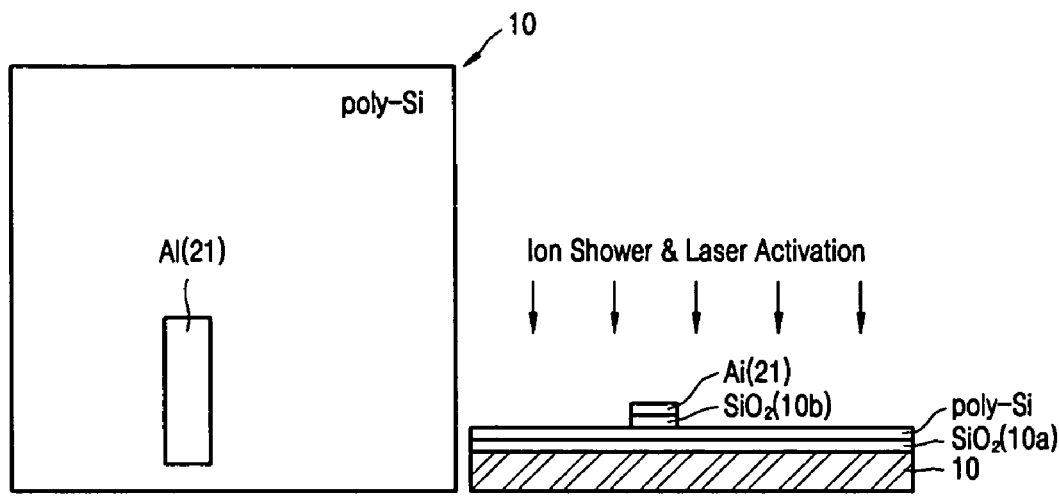

Referring to FIG. 6G, the portions not covered by the gate 21 are doped by an ion shower process and activated by using 308 nm XeCl excimer laser.

Figure 6H:
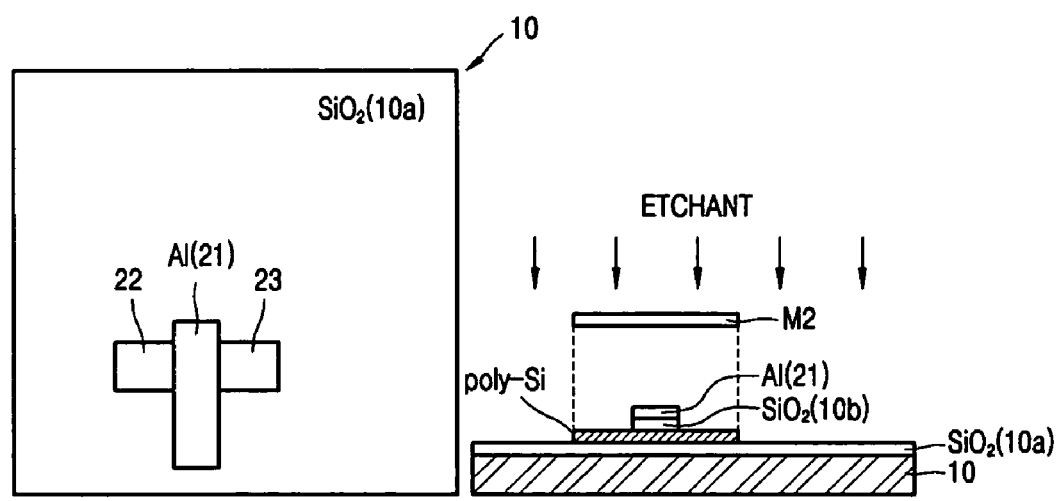

Referring to FIG. 6H, the portions of the poly-Si layer not covered by the gate 21 are patterned by dry etch by using a second mask M2 to form a source 22 and a drain 23. The portion of the poly-Si layer under the gate 21 is not doped to operate as a channel afterward.

Figure 6I:
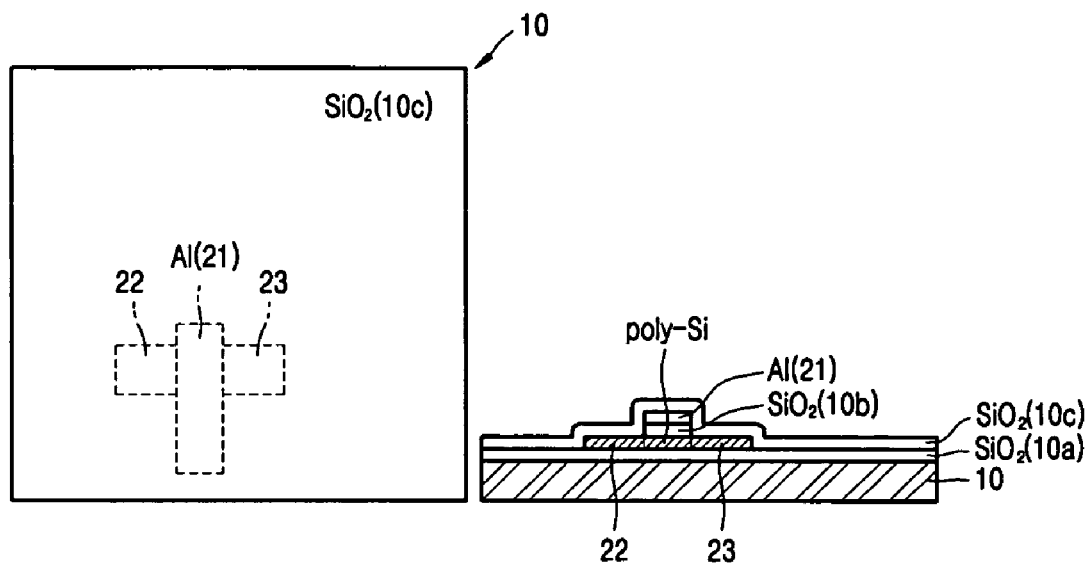

Referring to FIG. 6I, a $SiO_2$ third insulating layer 10c as an ILD is formed on the structure to a thickness of about 3,000 Å by ICP-CVD, PE-CVD, or sputtering.

Figure 6J:
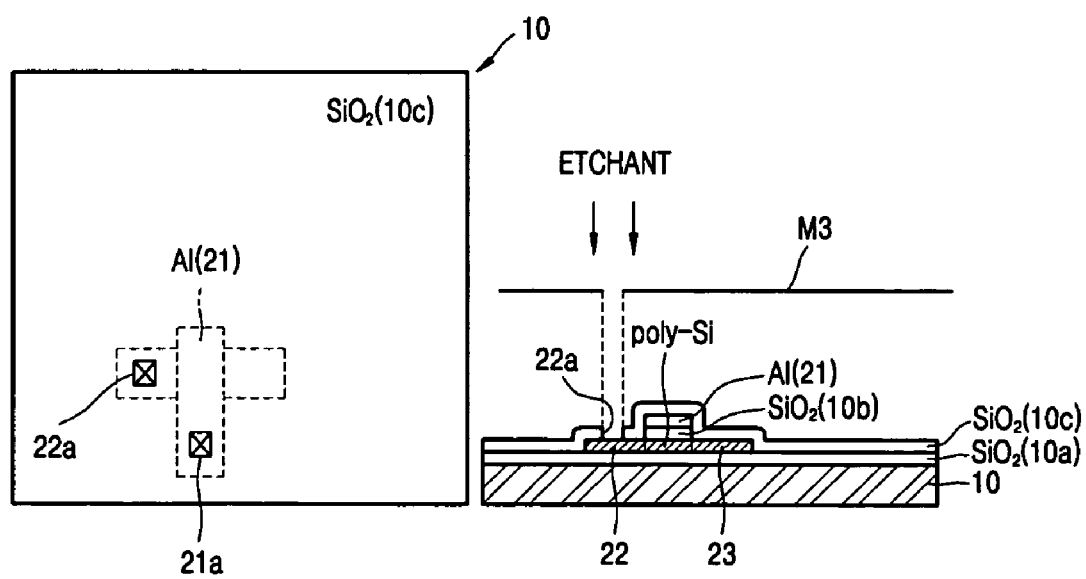

Referring to FIG. 6J, a source contact hole 22a and a gate contact hole 21a are formed in the $SiO_2$ third insulating layer 10c by using a third mask M3.

Figure 6K:
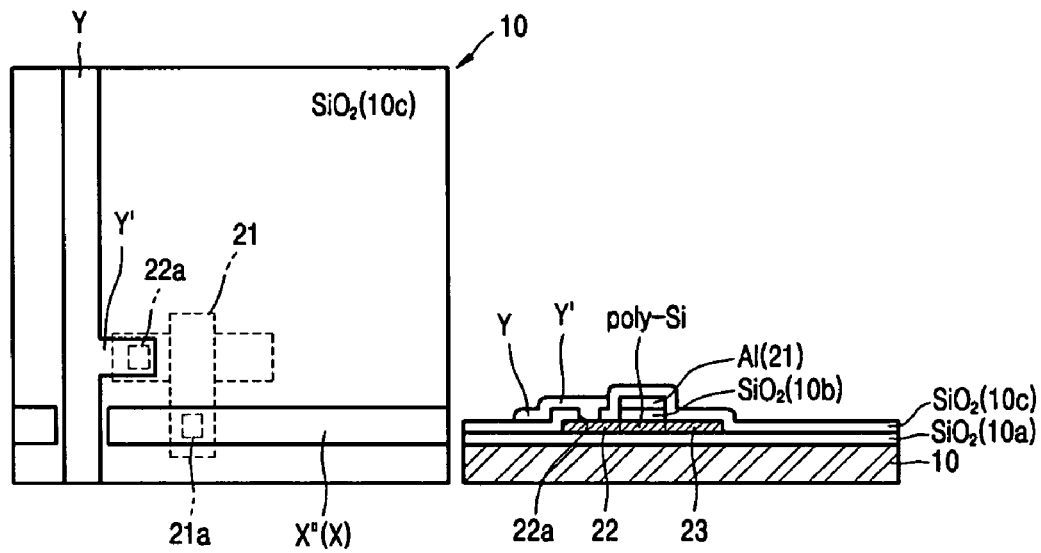

Referring to FIG. 6K, a source bus line Y and a gate bus line X are formed on the structure of FIG. 6J. Here, the source bus line Y and the gate bus line X are formed by performing a sputtering deposition of an Al layer having a thickness of 2,000 Å and a patterning process by using a fourth mask (not shown). The source bus line Y extends over the source contact hole 22a to have a source bus extension unit Y' of contacting the source 22 located under the source bus extension unit Y'. In addition, the gate bus line X is cut at the portion overlapping the source bus line Y and has the main bus line X" overlapping the gate contact hole 21a.

Figure 6L:
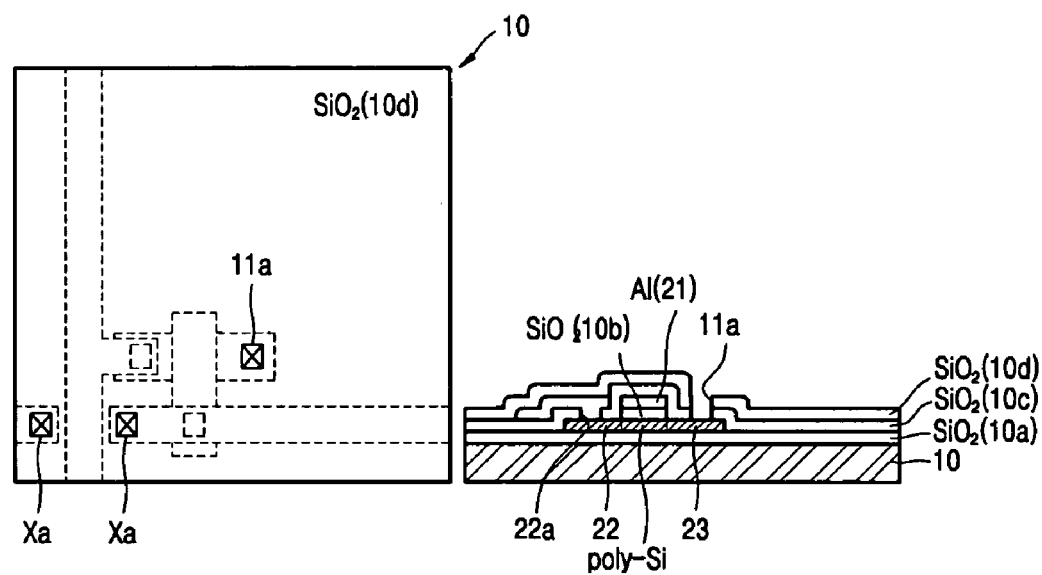

Referring to FIG. 6L, a $SiO_2$ fourth insulating layer 10d is formed on the structure of FIG. 6K by ICP-CVD, PE-CVD, or sputtering. The fourth insulating layer 10d as a second ILD is formed to a thickness of about 3,000 Å, and the jumper line X' of the gate bus line X and a pixel electrode 11 will be formed on the fourth insulating layer 10d.

Figure 6M:
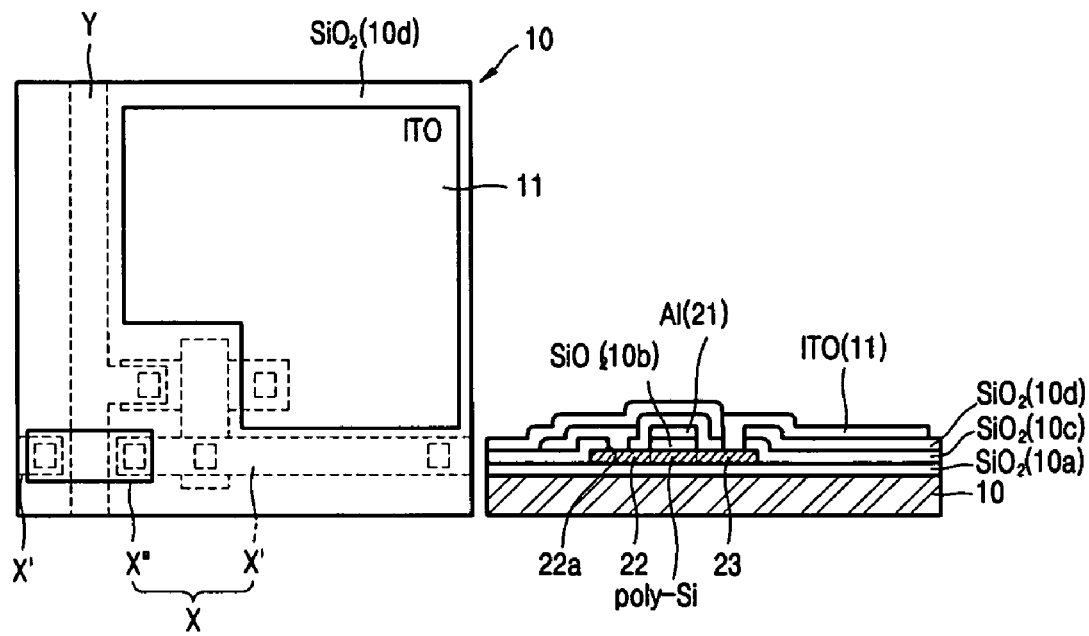

Referring to FIG. 6M, a conductive material, for example, an ITO layer, is deposited on the structure of FIG. 6L and patterned to form the pixel electrode 11 and the jumper line X". Here, the jumper line X" connects the main lines X' of the gate bus line X, which are located at the both sides of the source bus line Y, through a contact hole Xa, in order to form a complete gate bus line X.

Figure 7:
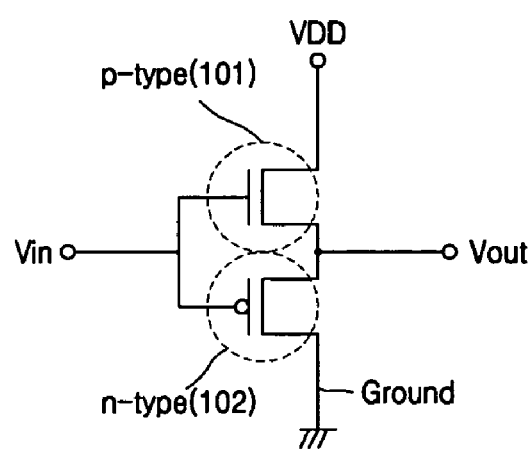
FIG. 7 is a circuit diagram of a semiconductor device according to an embodiment of the present invention.

FIG. 7 is a circuit diagram illustrating a CMOS. Referring to FIG. 7, a first transistor, for example, a p-type transistor 101, and a second transistor, for example, an n-type transistor 102, form one inverter. The source of the p-type transistor 101 and the drain of the n-type transistor 102 are connected to an output line Vout, and the gates of the p-type transistor 101 and the n-type transistor 102 are connected to an input line Vin. A driving voltage Vdd is applied to the drain of the p-type transistor 101, and the source of the n-type transistor 102 is connected to a ground line Ground. The structure of the CMOS is well known to the skilled in the art, thus the description of the CMOS will be omitted.

Figure 8:
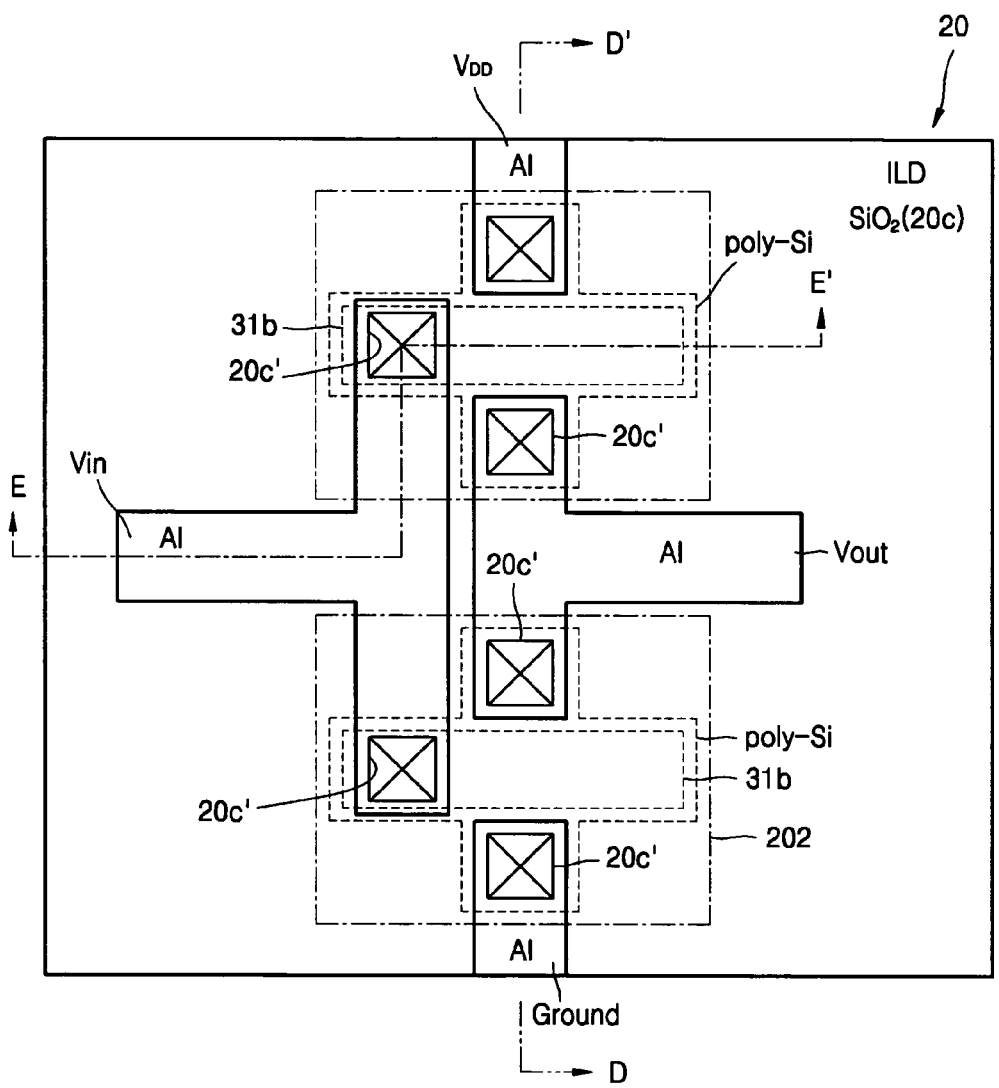
FIG. 8 is a plain view illustrating the layout of a semiconductor device according to an embodiment of the present invention.
Figure 9:
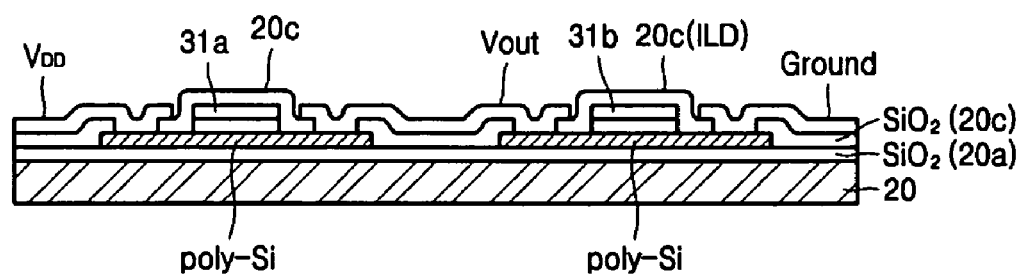
FIG. 9 is a sectional view cut along the line D-D' of FIG. 8.
Figure 10:
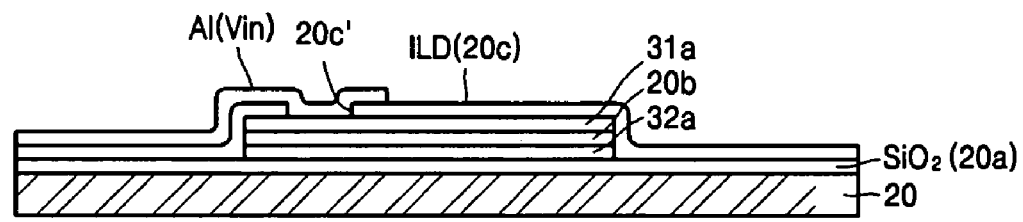
FIG. 10 is a sectional view cut along the line E-E' of FIG. 8.

FIG. 8 is a plain view illustrating the layout of a CMOS according to the present invention. FIG. 9 is a sectional view cut along the line D-D' of FIG. 8, and FIG. 10 is a sectional view cut along the line E-E' of FIG. 8. Portions denoted by ■ are contact holes 20c', which connect elements located on and under an ILD insulating layer 20c.

Referring to FIGS. 8 and 9, the driving voltage line Vdd, the ground line Ground, and the output line Vout contact a poly-Si layer poly-Si through the contact holes 20c' formed in the ILD layer 20c. Here, the portion to which the driving line Vdd is contacted is the drain of the p-type transistor 101, and the portion to which the ground line Ground is contacted is the source of the n-type transistor 102. In addition, the portions to which the output line Vout is contacted are the source of the p-type transistor 101 and the drain of the n-type transistor 102. Here, the lines are formed of a metal, for example, aluminum.

Referring to FIGS. 8 and 10, the input line Vin is split to connect to a gate 31a of the p-type transistor 101 and a gate 31b of the n-type transistor 102 through the contact holes 20c', which are formed in the ILD layer 20c. Here, the gate 31a and the input line Vin are formed of a metal, for example, aluminium.

The gates 31a and 31b are separated from the input line Vin, in order to solve the problem of a parasitic capacitance by limiting the existence of the poly silicon under the gates 31a and 31b. In other words, a semiconductor device according to the present invention, for example, a TFT or a CMOS, does not have a silicon layer under a gate bus line and an input line.

A method of fabricating a TFT according to an embodiment of the present invention will now be described with reference to FIGS. 11A through 11M. Here, left portions of FIGS. 11A through 11M are plain views and right portions of FIGS. 11A through 11M are sectional views.

Figure 11A:
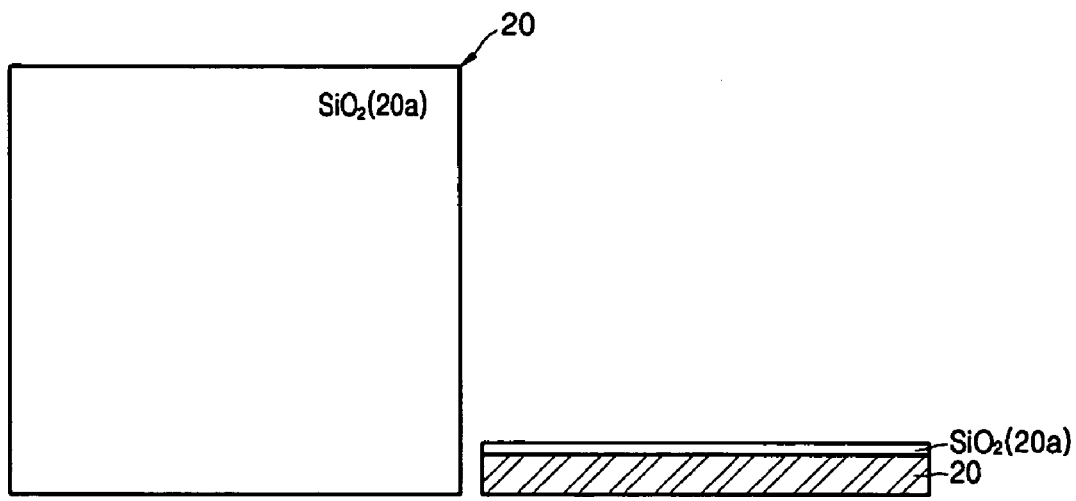
FIGS. 11A through 11M illustrate a method of manufacturing a CMOS according to an embodiment of the present invention.

Referring to FIG. 11A, a $SiO_2$ first insulating layer 20a is formed on a substrate 20 by CVD.

Figure 11B:
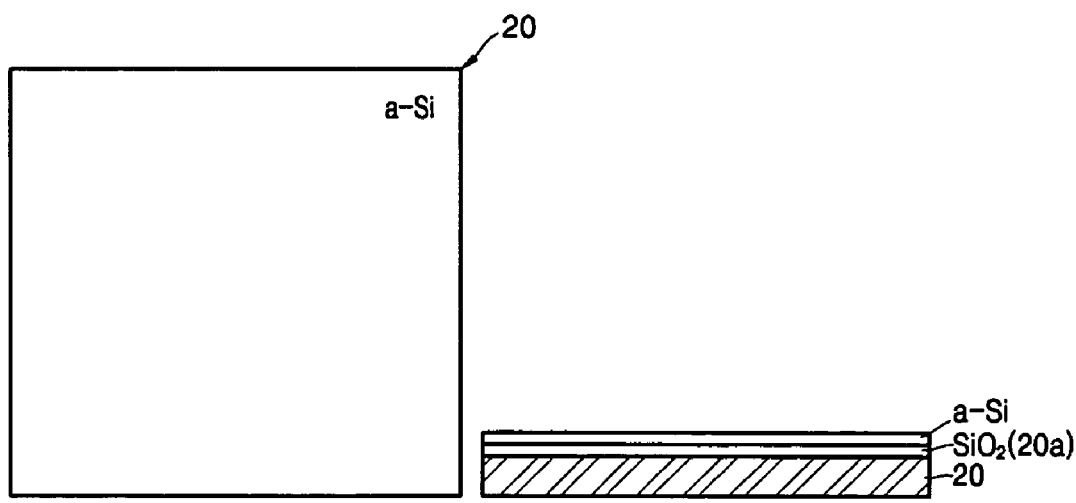

Referring to FIG. 11B, an a-Si layer is formed on the substrate 20 on which the first insulating layer 20a is formed, by sputtering or PECVD.

Figure 11C:
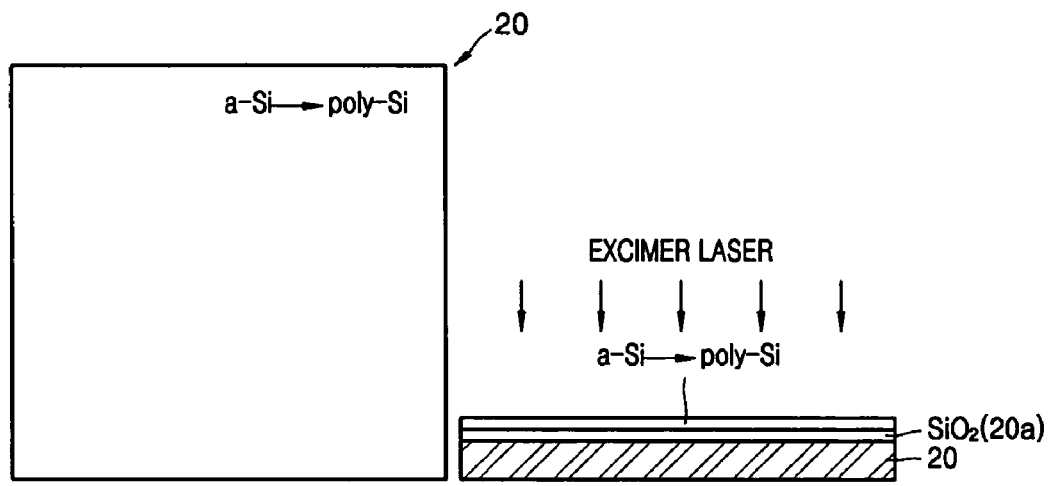

Referring to FIG. 11C, excimer laser annealing is performed on the a-Si layer to crystallize the a-Si layer, thus a poly-Si layer is obtained. Here, the excimer laser annealing is performed by shooting 308 nm XeCl excimer laser having an energy density of 150 to 300 $mJ/cm^2$ for once to ten times.

Figure 11D:
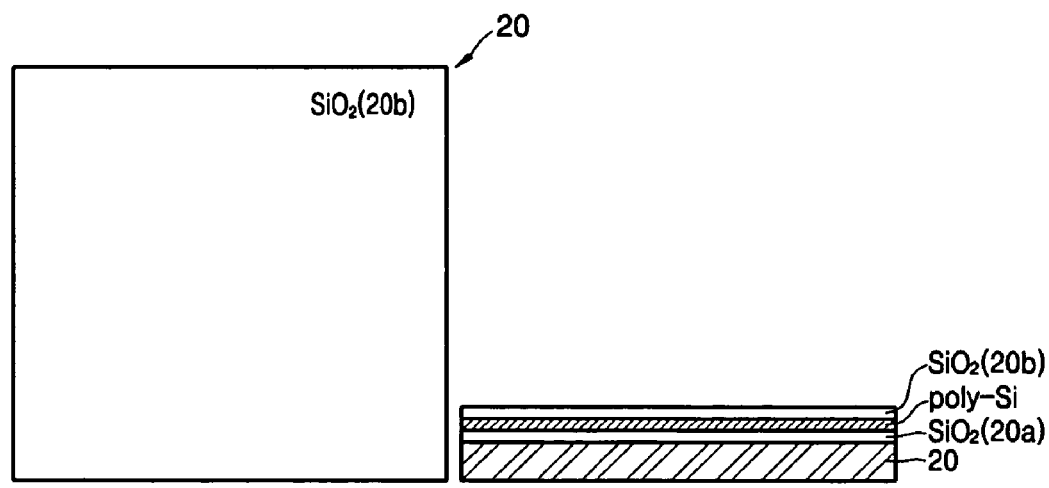

Referring to FIG. 11D, a $SiO_2$ second insulating layer 20b to be used as a gate insulating layer is formed on the poly-Si layer to a thickness of about 1,000 Å, by ICP-CVD, PE-CVD, or sputtering.

Figure 11E:
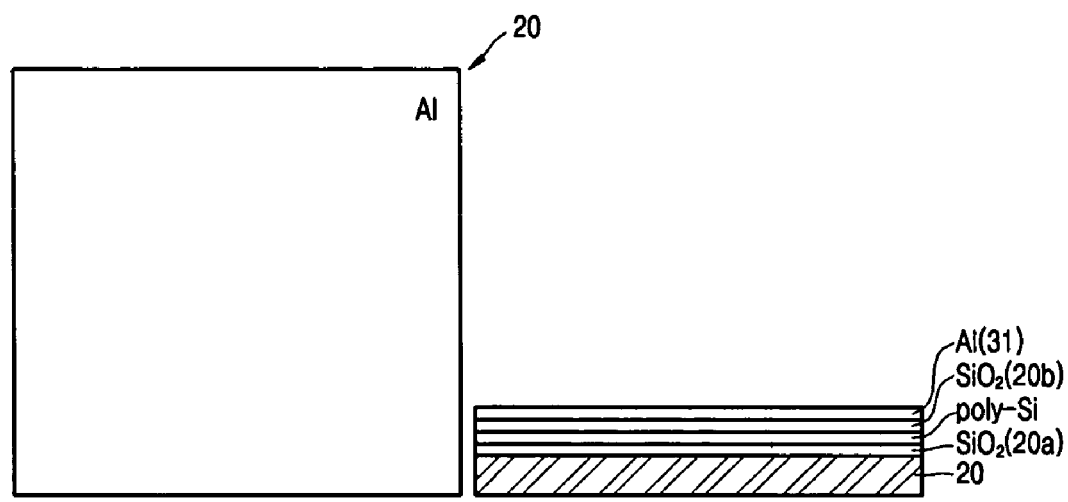

Referring to FIG. 11E, a metal layer, for example, an Al layer 31, to be used as gates 31a and 31b are formed on the second insulating layer 20b by sputtering.

Figure 11F:
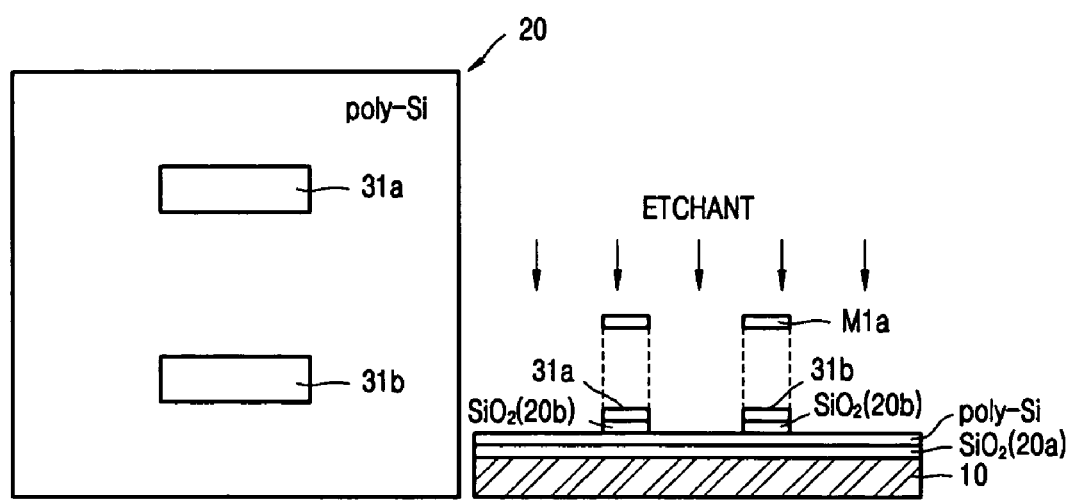

Referring to FIG. 11F, the Al layer 31 is etched by a dry etch by using a first mask M1a to form the gates 31a and 31b that are formed in a line. Here, the first mask M1a has a pattern corresponding to the shape of the gates 31a and 31b. The gates 31a and 31b are patterned, and the gate insulating layer 20b under the gates 31a and 31b are patterned in the same shape as the gates 31a and 31b. Accordingly, the portions of the poly-Si layer not covered by the gates 31a and 31b are exposed.

Figure 11G:
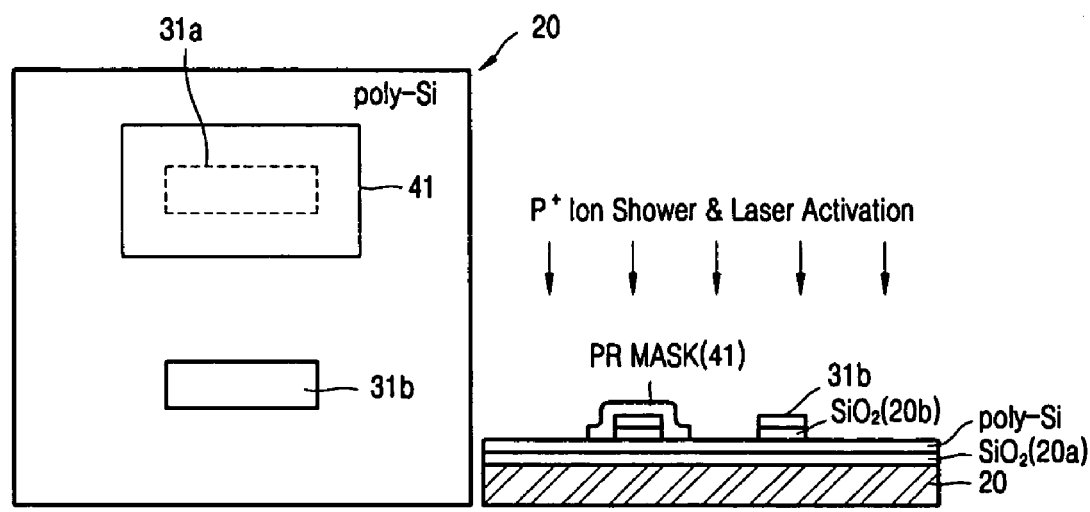

Referring to FIG. 11G, a region to form a p-type transistor is covered by a PR mask 41, and a first impurity, for example, P+, is doped to the exposed region.

Figure 11H:
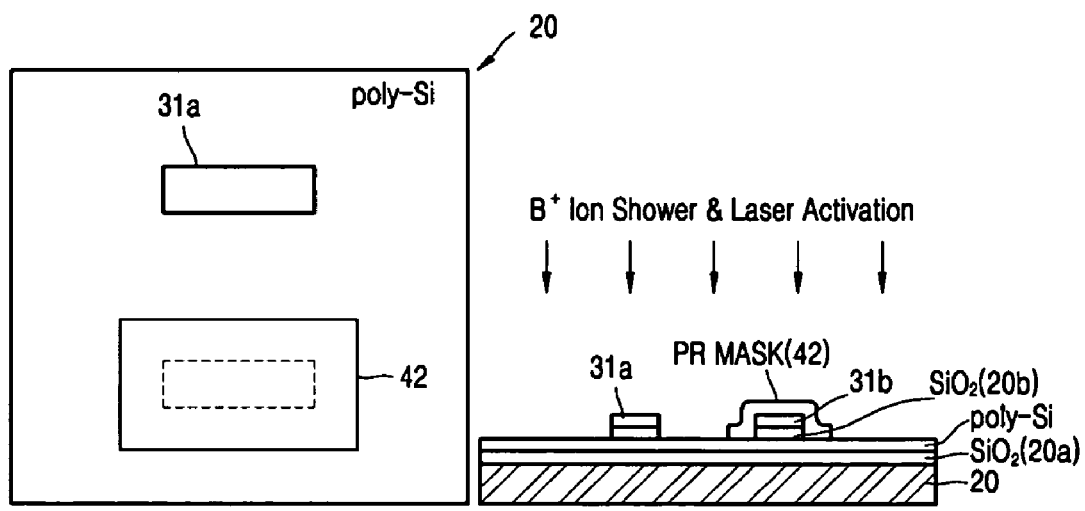

Referring to FIG. 11H, the PR mask 41 is stripped and activated by using 308 nm XeCl excimer laser. Then, a region to form an n-type transistor is covered by a PR mask 42, and a second impurity, for example, B+, is doped to the exposed region.

Figure 11I:
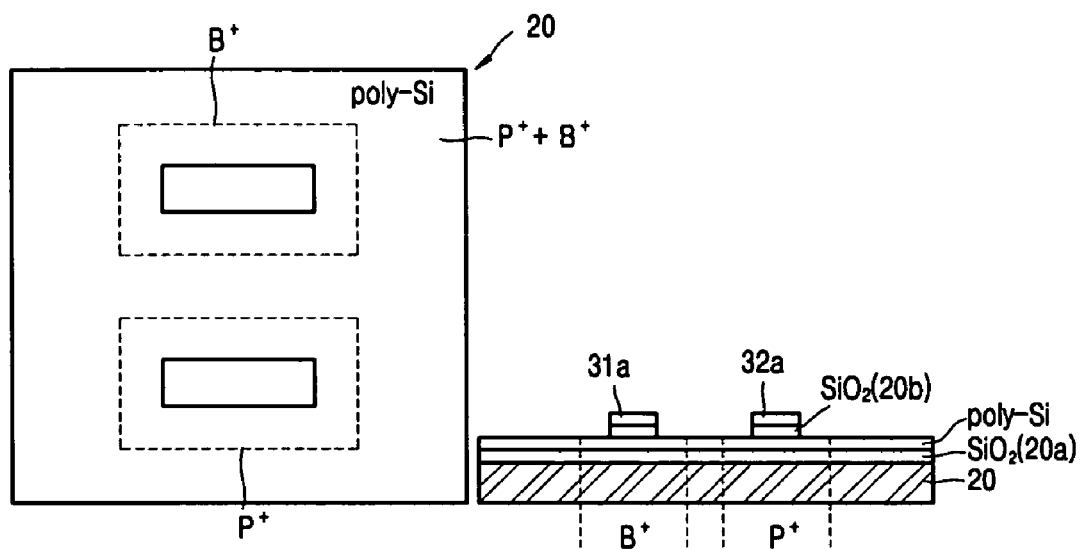

Referring to FIG. 11I, the PR mask 42 is stripped. As a result, a P+ doped region and a B+ doped region are formed around the gates 31a and 31b, respectively. In addition, P+ and B+ are mixed on the other regions, which will be removed.

Figure 11J:
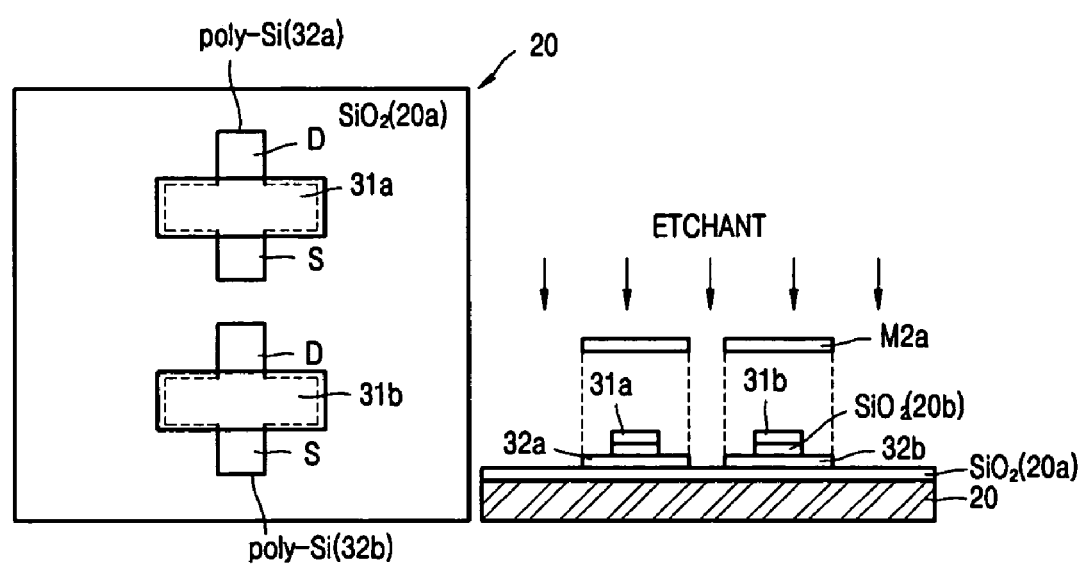

Referring to FIG. 11J, the portions of the poly-Si layer not covered by the gates 31a and 31b are patterned by dry etch by using a second mask M2a to form poly-Si 32a and 32b corresponding to the gates 31a and 31b, respectively. The ends of the poly-Si 32a and 32b are doped sources and drains. On the other hand, the portions of the poly-Si layer under the gates 31a and 31b are not doped and operate as channels between the sources and the drains.

Figure 11K:
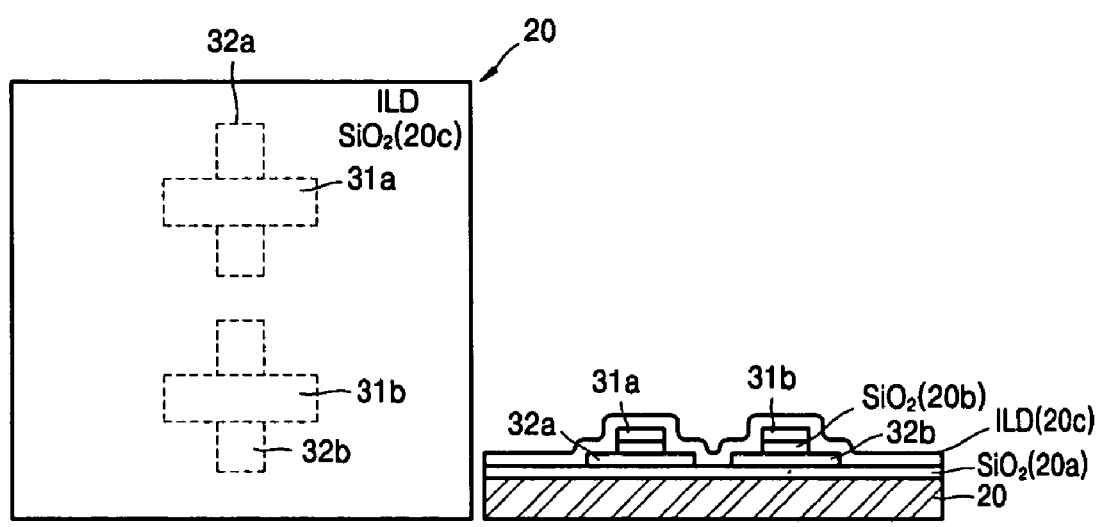

Referring to FIG. 11K, a $SiO_2$ third insulating layer 20c as an ILD is formed on the structure of FIG. 11J to a thickness of about 3,000 Å, by ICP-CVD, PE-CVD, or sputtering.

Figure 11L:
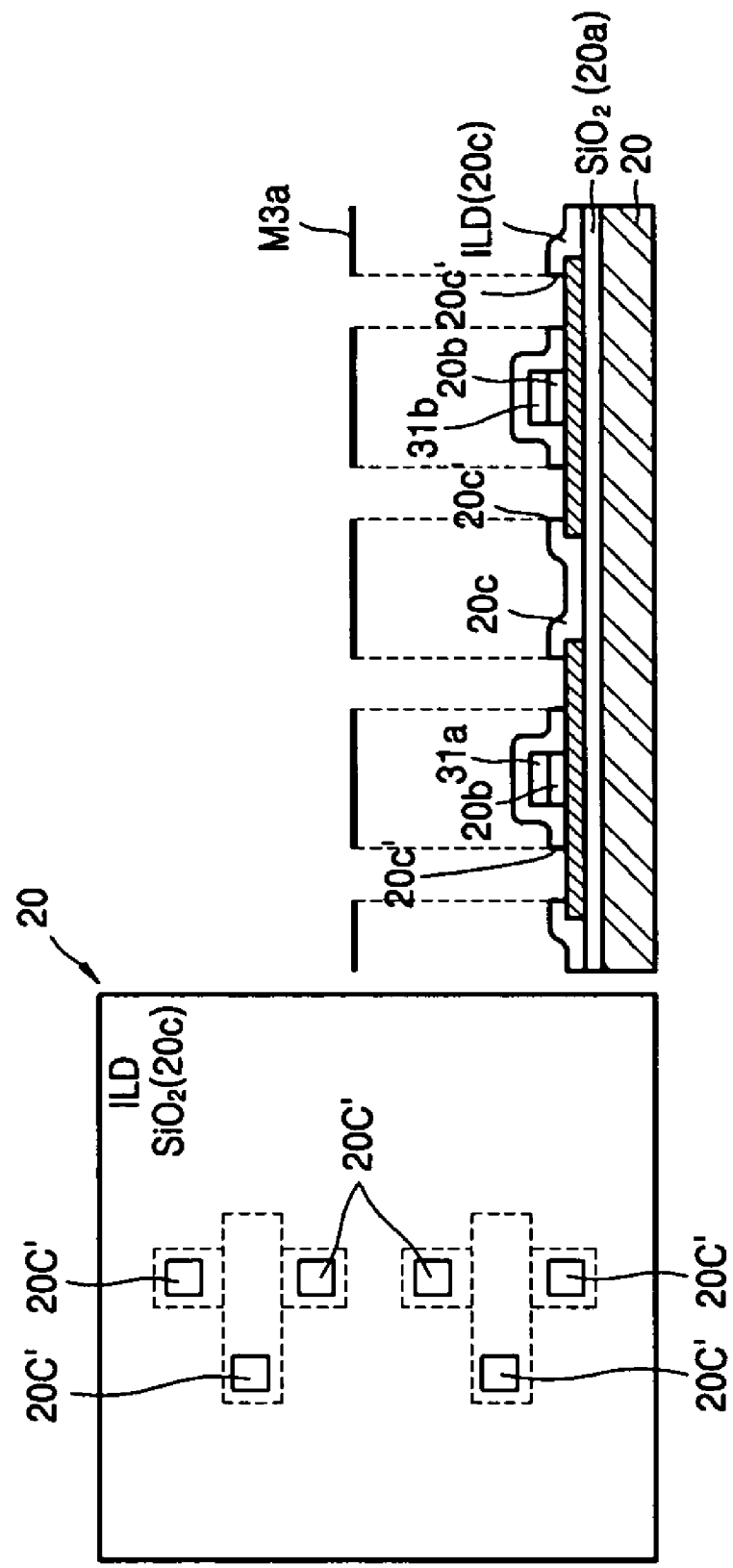

Referring to FIG. 11L, contact holes 20c' to contact the gates, the sources, and the gates of the p-type and n-type transistors are formed in the $SiO_2$ third insulating layer 20c by using a third mask M3a.

Figure 11M:
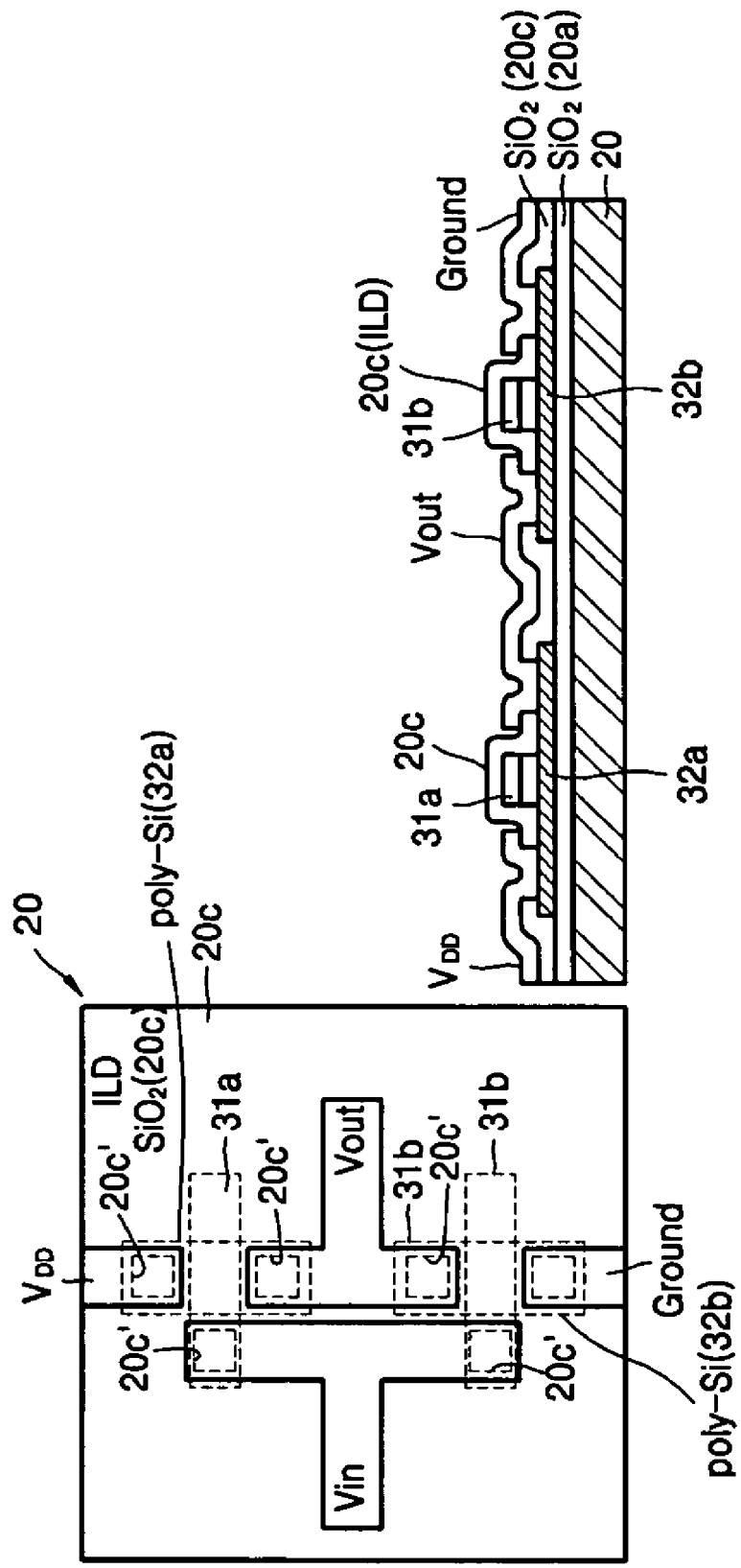

Referring to FIG. 11M, the input line Vin, the output line Vout, the driving voltage line Vdd, and the ground line Ground are formed on the third insulating layer 20c by depositing an Al layer to a thickness of 2,000 Å and patterning the Al layer by using a fourth mask (not shown). The input line Vin, the output line Vout, the driving voltage line Vdd, and the ground line Ground electrically contact corresponding layers through the contact holes 20c'.

The above described method of fabricating a CMOS according to the embodiment of the present invention is a portion of a method of fabricating a CMOS, and the other portion of the method of fabricating a CMOS is the same as the well known method of fabricating a CMOS.

The present invention reduces a parasitic capacitance, which causes the distortion and the delay of gate signals, by remaining a silicon material layer under gates only.

According to the present invention, a semiconductor device, for example, a TFT or a CMOS, may be obtained, and the semiconductor device according to the present invention can be applied to a flat panel display, for example, an active matrix LCD, an active matrix OLED, or a CMOS of a semiconductor memory.

While the present invention has been particularly shown and described with reference to an exemplary embodiment thereof, it will be understood by those of ordinary skill in the art that various changes in form and details may be made therein without departing from the spirit and scope of the present invention as defined by the following claims.

What is claimed is:

1. A thin film transistor (TFT) comprising:
   a substrate;
   a silicon material layer having a drain and a source, which are defined by doping, and a channel region between the drain and the source;
   a gate having a contact unit for electrically connecting a region overlapping the channel region to a gate bus line;
   a gate insulating layer formed under the gate; and
   a source bus line formed in a first direction;
   wherein the gate bus line extends in a second direction, which is perpendicular to the first direction, wherein the contact unit electrically connects the gate to the gate bus line through a via hole in an insulating layer over said gate.

2. The TFT of claim 1, wherein the gate and the gate insulating layer under the gate have the same pattern and the gate insulating layer does not have the same pattern as the gate bus line.

3. The TFT of claim 1, wherein the channel region of the silicon material layer is formed under the gate, coextensive with the entire area of the gate.

4. A thin film transistor (TFT) comprising:
   a substrate;
   a silicon material layer having a drain and a source, which are defined by doping, and a channel region between the drain and the source;
   a gate having a contact unit for electrically connecting a region overlapping the channel region to a gate bus line;
   a gate insulating layer formed under the gate; and
   a source bus line formed in a first direction;
   wherein the gate bus line extends in a second direction, which is perpendicular to the first direction, and electrically connects the gate to the gate bus line through the contact unit of the gate;
   wherein the gate bus line includes a main line arranged between the source bus line and a jumper line formed over the source bus lines.

5. The TFT of claim 4, wherein the source bus line and the main line of the gate bus line are located on the same layer.

6. A method of fabricating a TFT including a silicon material layer having a drain and a source defined by doping and a channel region between the drain and the source; a gate corresponding to the channel region; and a gate insulating layer formed under the gate, the method comprising:

forming a silicon material layer on a substrate;

forming a gate insulating material layer on the silicon material layer;

forming a gate material layer on the gate insulating material layer;

forming a gate corresponding to the channel region and a gate insulating layer under the gate by patterning the gate material layer and the gate insulating material thereby forming a gate structure;

doping and activating a portion of the silicon material layer, which is not covered by the gate;

forming a channel region, which is covered by the gate, and a source and a drain, which are not covered by the gate, by patterning the silicon material layer;

forming an insulating layer on the gate structure; and forming a source bus line and a gate bus line, which are electrically connected to the source and the gate, on the insulating layer, wherein the gate bus line is connected to the gate by a contact unit that includes a via connection through the insulating layer.

7. The method of claim 6, wherein the formation of the source bus line and the gate bus line further comprises forming a main gate bus line, which is perpendicular to the source bus line and does not overlap the source bus line, by depositing and patterning a metal layer.

8. The method of claim 6, further comprising forming an insulating layer on the substrate before forming the silicon material layer.

9. The method of claim 6, wherein the formation of the silicon material layer on the substrate comprises:

depositing an amorphous silicon; and crystallizing the amorphous silicon.

10. A method of fabricating a TFT including a silicon material layer having a drain and a source defined by doping and a channel region between the drain and the source; a gate corresponding to the channel region; and a gate insulating layer formed under the gate, the method comprising:

forming a silicon material layer on a substrate;

forming a gate insulating material layer on the silicon material layer;

forming a gate material layer on the gate insulating material layer;

forming a gate corresponding to the channel region and a gate insulating layer under the gate by patterning the gate material layer and the gate insulating material thereby forming a gate structure;

doping and activating a portion of the silicon material layer, which is not covered by the gate;

forming a channel region, which is covered by the gate, and a source and a drain, which are not covered by the gate, by patterning the silicon material layer;

forming an insulating layer on the gate structure; and forming a source bus line and a gate bus line, which are electrically connected to the source and the gate, on the insulating layer;

wherein the formation of the source bus line and the gate bus line further comprises:

forming an insulating layer on the source bus line and the gate bus line;

forming a contact hole corresponding to the gate bus line, in the insulating layer; and forming a jumper line, which is connected to the gate bus line through the contact hole, on the insulating layer.

* * * * *